(12) United States Patent
Sorensen et al.

(10) Patent No.: US 8,992,723 B2
(45) Date of Patent: Mar. 31, 2015

(54) RF BUS AND RF RETURN BUS FOR PLASMA CHAMBER ELECTRODE

(75) Inventors: Carl A. Sorensen, Morgan Hill, CA (US); Jozef Kudela, Sunnyvale, CA (US); Robin L. Tiner, Santa Cruz, CA (US); Suhail Anwar, San Jose, CA (US); John M. White, Hayward, CA (US)

(73) Assignee: Applied Material, Inc., Santa Clara, CA (US)

( * ) Notice: Subject to any disclaimer, the term of this patent is extended or adjusted under 35 U.S.C. 154(b) by 842 days.

(21) Appl. No.: 12/705,600

(22) Filed: Feb. 13, 2010

(65) Prior Publication Data

US 2010/0206483 A1    Aug. 19, 2010

Related U.S. Application Data

(60) Provisional application No. 61/152,601, filed on Feb. 13, 2009.

(51) Int. Cl.
*H01L 21/3065* (2006.01)
*C23C 16/505* (2006.01)
*H01J 37/32* (2006.01)

(52) U.S. Cl.
CPC ..... *H01J 37/32174* (2013.01); *H01J 37/32091* (2013.01)
USPC .................. 156/345.43; 118/723 E

(58) Field of Classification Search
CPC ............... H01J 37/32091; H01J 37/32174; H01J 37/32568; H01J 37/32577; H01J 37/32532; C23C 16/505
See application file for complete search history.

(56) References Cited

U.S. PATENT DOCUMENTS

| | | |
|---|---|---|
| 5,252,178 A | 10/1993 | Moslehi |
| 5,272,417 A | 12/1993 | Ohmi |

(Continued)

FOREIGN PATENT DOCUMENTS

| | | |
|---|---|---|
| DE | 4242894 A1 | 6/1994 |
| EP | 0961307 A2 | 12/1999 |

(Continued)

OTHER PUBLICATIONS

K. A. Cornnor, Supplement note (Two-Wire and Parallel Plate Transmission Lines, Spring 2000, RPI Plasma Dynamics Laboratory in the department of ECSE (Electrical, Computer & System Engineering) in Rensselaer Polytechnic Institute, http://hibp.ecse.rpi.edu/~connor/education/Fields/TwoWire-ParallelPlateLines.PDF.*

(Continued)

*Primary Examiner* — Keath Chen
*Assistant Examiner* — Aiden Lee
(74) *Attorney, Agent, or Firm* — Robert J. Stern

(57) ABSTRACT

For coupling RF power from an RF input of a plasma chamber to the interior of a plasma chamber, an RF bus conductor is connected between the RF input and a plasma chamber electrode. In one embodiment, an RF return bus conductor is connected to an electrically grounded wall of the chamber, and the RF bus conductor and the RF return bus conductor have respective surfaces that are parallel and face each other. In another embodiment, the RF bus conductor has a transverse cross section having a longest dimension oriented perpendicular to the surface of the plasma chamber electrode that is closest to the RF bus conductor.

7 Claims, 5 Drawing Sheets

(56) References Cited

U.S. PATENT DOCUMENTS

| | | | |
|---|---|---|---|
| 5,573,595 A | 11/1996 | Dible | |
| 5,733,511 A | 3/1998 | De Francesco | |
| 5,882,411 A | 3/1999 | Zhao | |
| 6,079,356 A | 6/2000 | Umotoy | |
| 6,152,071 A * | 11/2000 | Akiyama et al. | 118/723 VE |
| 6,155,202 A | 12/2000 | Nakano | |
| 6,228,229 B1 | 5/2001 | Raaijmakers | |
| 6,254,738 B1 | 7/2001 | Stimson | |
| 6,353,201 B1 | 3/2002 | Yamakoshi | |
| 6,359,250 B1 | 3/2002 | Blonigan | |
| 6,422,172 B1 | 7/2002 | Tanaka | |
| 6,456,010 B2 * | 9/2002 | Yamakoshi et al. | 315/111.21 |
| 6,477,980 B1 | 11/2002 | White | |
| 6,538,388 B2 | 3/2003 | Nakano | |
| 6,552,297 B2 | 4/2003 | Blonigan | |
| 6,620,290 B2 | 9/2003 | Yamamoto | |
| 6,772,827 B2 | 8/2004 | Keller | |
| 6,824,658 B2 | 11/2004 | Gopalraja | |
| 6,827,815 B2 | 12/2004 | Hytros | |
| 6,857,387 B1 | 2/2005 | Sun | |
| 6,863,020 B2 | 3/2005 | Mitrovic | |
| 6,884,635 B2 | 4/2005 | Parsons | |
| 6,899,787 B2 * | 5/2005 | Nakano et al. | 156/345.44 |
| 6,916,401 B2 | 7/2005 | Long | |
| 7,083,702 B2 | 8/2006 | Blonigan | |
| 7,141,516 B2 | 11/2006 | Kawamura | |
| 7,153,387 B1 | 12/2006 | Tomoyasu | |
| 7,164,236 B2 | 1/2007 | Mitrovic | |
| 7,205,034 B2 | 4/2007 | Kawamura | |
| 7,270,713 B2 | 9/2007 | Blonigan | |
| 2001/0021422 A1 | 9/2001 | Yamakoshi | |
| 2002/0023899 A1 | 2/2002 | Khater | |
| 2003/0037881 A1 | 2/2003 | Barnes | |
| 2003/0056901 A1 * | 3/2003 | Nakano et al. | 156/345.47 |
| 2003/0079983 A1 | 5/2003 | Long et al. | |
| 2004/0194709 A1 | 10/2004 | Yamagishi | |
| 2005/0183827 A1 | 8/2005 | White | |
| 2006/0021580 A1 * | 2/2006 | Hirano | 118/722 |
| 2006/0027327 A1 * | 2/2006 | Sorensen et al. | 156/345.47 |
| 2006/0049138 A1 | 3/2006 | Miyake | |
| 2006/0105114 A1 | 5/2006 | White | |
| 2008/0274297 A1 | 11/2008 | Furuta | |
| 2009/0101069 A1 | 4/2009 | Anwar | |
| 2009/0159423 A1 | 6/2009 | Kudela | |
| 2009/0202741 A1 | 8/2009 | Stimson | |
| 2010/0089319 A1 | 4/2010 | Sorensen | |
| 2011/0126405 A1 | 6/2011 | Baek | |

FOREIGN PATENT DOCUMENTS

| | | |
|---|---|---|
| JP | 08-236294 A | 9/1996 |
| JP | 2002-260899 A | 9/2002 |
| JP | 2004-193565 A | 8/2004 |

OTHER PUBLICATIONS

Jackson, J. D. (1975). Classical Electrodynamics. Wiley. p. 262. in reference of Wikipedia. 'Relation between inductance and capacitance', http://en.wikipedia.org/wiki/Inductance#cite_note-class_electro75-15.*

M.A. Lieberman et al., "Standing wave and skin effects in large-area, high-frequency capacitive discharges", Plasma Sources Sci. Technol., vol. 11, pp. 283-293, 2002, UK.

Wikipedia article "Microstrip", Nov. 12, 2007, http://web.archive.org/web/20071114062529/http://en.wikipedia.org/wiki/Microstrip.

Wikipedia article "Microstrip", Feb. 12, 2013, http://en.wikipedia.org/wiki/Microstrip.

* cited by examiner

RF BUS AND RF RETURN BUS FOR PLASMA CHAMBER ELECTRODE

CROSS REFERENCE TO RELATED APPLICATIONS

This patent application claims priority of U.S. provisional patent application No. 61/152,601 filed Feb. 13, 2009 by Carl A. Sorensen et al.

TECHNICAL FIELD

The invention relates generally to coupling RF power to an electrode of a plasma chamber used for fabricating electronic devices such as semiconductors, displays, solar cells, and solid state light emitting devices. The invention relates more specifically to RF bus and RF return bus conductors connected to the electrode, and to the orientation of the RF bus conductor relative to the electrode. The invention improves the efficiency of coupling RF power to plasma within the chamber.

BACKGROUND ART

Plasma chambers commonly are used to perform processes for fabricating electronic devices such as semiconductors, displays and solar cells. Such plasma fabrication processes include chemical vapor deposition of semiconductor, conductor or dielectric layers on the surface of a workpiece, or etching of selected portions of such layers on the workpiece surface.

FIG. 1 shows a conventional plasma chamber. The workpiece 10 is supported on a susceptor 12 within the chamber. In performing a plasma process on the workpiece, one or more process gases are dispensed into the chamber through a gas inlet manifold 20-26. The gas inlet manifold includes a manifold back wall 20, a showerhead 22 (also called a gas distribution plate or diffusor), and a suspension 24, all of which collectively enclose a volume which is the interior 26 of the gas inlet manifold.

A gas inlet conduit 28 extends through the center of the manifold back wall 20. A gas source, not shown, supplies process gases to the upper end of the gas inlet conduit. The process gases flow from the gas inlet conduit into the interior 26 of the gas inlet manifold, and then are dispensed into the interior 11 of the plasma chamber through numerous gas passageways in the showerhead 22.

The gas inlet manifold 20-26 also functions as an electrode to couple RF power from an RF power supply to a plasma in the interior 11 of the plasma chamber between the showerhead and the susceptor. The manifold back wall 20, showerhead 22, suspension 24 and gas inlet conduit 28 are electrically conductive. A first RF cable 36 couples RF power from the output of an RF power supply 32 to an impedance matching network 34. A second RF cable 30 couples RF power from the impedance matching network 34 to the gas inlet conduit 28, which functions as an RF input 40 of the plasma chamber.

The gas inlet conduit 28 is electrically connected to the center of the manifold back wall. RF power flows radially outward through the manifold back wall from the gas inlet conduit at the center of the manifold back wall to the four suspension walls 24 at each of the four sides of the manifold back wall, and then through the four suspension walls to the four sides of the showerhead 22. The RF power is coupled from the showerhead to the plasma in the plasma chamber interior 11 between the showerhead and the susceptor 12.

A shortcoming of this conventional RF power connection design is that the complex impedance of the electrical load presented to the RF input 40 (i.e., where the second RF cable 30 electrically connects to the gas inlet conduit 28) typically has an inductive component significantly greater than its resistive component, which produces high peak voltages in the gas inlet manifold 20-26, the impedance matching network 34, and the RF circuitry connected between them. Such high peak voltage is undesirable because it can cause atmospheric arcing (i.e., electrical discharge) in the portions of the RF circuitry that are exposed to atmosphere, and it can cause failure of the capacitors within the RF circuitry.

SUMMARY OF THE INVENTION

The invention is an apparatus and method for coupling RF power from an RF input of a plasma chamber to the interior of a plasma chamber. The invention includes an RF bus conductor connected between the RF input and a plasma chamber electrode.

One aspect of the invention further includes an RF return bus conductor connected to an electrically grounded wall of the chamber. The RF bus conductor and the RF return bus conductor have respective surfaces that are parallel and face each other.

Advantageously, the parallel RF bus and RF return bus conductors reduce the inductance of the electrical connection between the RF input and the plasma chamber electrode. This reduced inductance advantageously reduces the peak voltages within the RF circuitry. This helps reduce the risk of atmospheric arcing (i.e., electrical discharge) in the portions of the RF circuitry that are exposed to atmosphere, and it helps reduce the risk of failure of the capacitors within the RF circuitry.

In another aspect of the invention, the RF bus conductor has a transverse cross section having a longest dimension oriented perpendicular to the surface of the plasma chamber electrode that is closest to the RF bus conductor. Advantageously, this orientation of the RF bus conductor reduces parasitic capacitive coupling of RF power to areas of the electrode other than locations where an electrical connection to the electrode is intended.

Preferably the plasma chamber electrode comprises a gas inlet manifold that includes: a manifold back wall through which a gas inlet conduit extends, a showerhead positioned below the back wall, and a showerhead suspension or other electrical conductor connected between back wall and the showerhead, wherein the RF bus conductor is connected to the back wall.

BEST MODE FOR CARRYING OUT THE INVENTION

1. Plasma Chamber Overview

Figure 2:
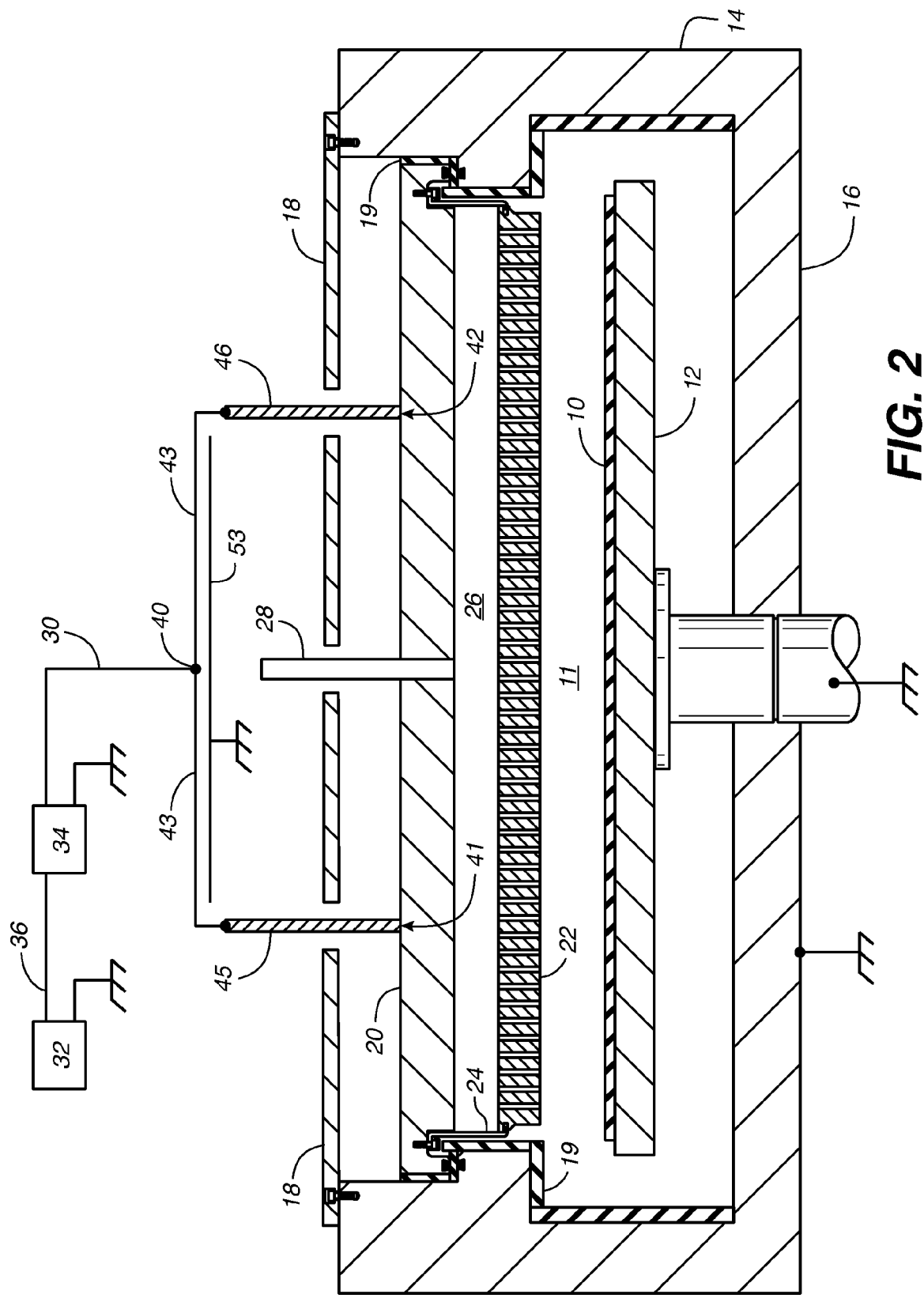
FIG. 2 is a partially schematic sectional side view of a plasma chamber according to the present invention. The section is taken through the center of the plasma chamber.

FIG. 2 shows a plasma chamber that includes one embodiment of the invention. Before describing the invention, the conventional features of the plasma chamber will be described.

A workpiece 10 is supported on a susceptor 12 within the interior 11 of the plasma chamber. The plasma chamber is intended to subject the workpiece to a plasma process step for fabricating on the workpiece electronic devices such as semiconductor devices, displays, solar cells, or solid state light emitting devices. Examples of a workpiece 10 that would be processed within the plasma chamber include a rectangular glass substrate on which flat panel displays are fabricated or a circular semiconductor wafer on which integrated circuits are fabricated.

The plasma chamber has an electrically conductive chamber wall 14-18, preferably aluminum, that provides a vacuum enclosure for the chamber interior 11. In the illustrated embodiment, the chamber side wall 14 and chamber bottom wall 16 are implemented as a unitary wall. The chamber wall also includes a top wall 18, also referred to as the chamber lid or top cover. All portions of the chamber wall are connected together electrically and are electrically grounded.

In performing a plasma process on the workpiece, one or more process gases are dispensed into the chamber through a gas inlet manifold 20-26. The gas inlet manifold includes a manifold back wall 20, a showerhead 22 (also called a gas distribution plate or diffusor), and a suspension 24, all of which collectively enclose a volume which constitutes the interior 26 of the gas inlet manifold.

A gas inlet conduit 28 extends through the center of the manifold back wall 20. A gas source, not shown, supplies process gases to the upper end of the gas inlet conduit. The process gases flow from the gas inlet conduit into the interior 26 of the gas inlet manifold, and then are dispensed, through numerous gas passageways in the showerhead 22, into the interior 11 of the plasma chamber between the showerhead and the susceptor 12.

The weight of the showerhead is supported by the suspension 24, which is supported by the manifold back wall 20, which is supported by the chamber side wall 14. The suspension 24 preferably is flexible so as to accommodate radial expansion and contraction of the showerhead as the temperature of the showerhead rises and falls. The suspension 24 has an upper end attached to the manifold back wall 20 and a lower end attached to the rim at the periphery of the showerhead 22. The latter attachment can be either fixed or sliding. For example, a sliding attachment can be implemented by resting the showerhead rim on the lower end of the suspension.

If the showerhead is rectangular as in the illustrated embodiment, the vertically extending portion of the suspension 24 preferably consists of four flexible sheets respectively attached to the four sides of the rectangular showerhead 22. Each sheet extends vertically between one side of the rectangular showerhead and a corresponding side of the rectangular-shaped manifold back wall 20.

The gas inlet manifold 20-26 also functions as an electrode to capacitively couple RF power to the plasma within the chamber. The manifold back wall 20, showerhead 22 and suspension 24 are electrically conductive, preferably aluminum. Dielectric liners 19 electrically and mechanically separate the RF powered components 20-24 of the gas inlet manifold from the electrically grounded chamber wall 14-18.

A first RF cable 36 couples RF power from the output of an RF power supply 32 to an impedance matching network 34. A second RF cable 30 couples RF power from the impedance matching network 34 to an RF input 40 of the plasma chamber. (The RF input relates to the novel aspects of the invention, so it will be described in the next section of this description "2. Basic Principles of the Invention".)

The first RF cable 36 typically is a coaxial RF cable having a characteristic impedance that matches the output impedance of the RF power supply. Because the impedance matching network 34 typically is mounted on or close to the chamber top wall 18, the second RF cable 30 typically is a short conductor whose length is less than one-tenth the wavelength of the RF power, hence there is no benefit in designing it to have a characteristic impedance matched to the load impedance. Regardless of the typical cables just described, throughout this patent specification we use the term "cable" to broadly encompass any conductor, including a single conductor or a transmission line having a plurality of conductors.

RF power flows from the output of the RF power supply 32 to the input of the impedance matching network 34, then from the output of the impedance matching network to the RF input 40 of the plasma chamber, then to the manifold back wall 20, then to the four suspension walls 24 at each of the four sides of the manifold back wall, and then through the four suspension walls to the four sides of the showerhead 22. The RF power is coupled from the showerhead to a plasma in the interior region 11 of the plasma chamber between the showerhead and the susceptor. Return RF power flows from the plasma to the electrically grounded chamber walls 14-18, and then to the electrical ground of the impedance matching network 34, and then to the electrical ground of the RF power supply 32.

The components of the impedance matching network 34 can be physically dispersed. For example, the impedance matching network can include one or more reactances (i.e., capacitors and inductors) mounted physically adjacent to or within the RF power supply, and one or more additional reactances mounted physically adjacent to or directly on the gas inlet manifold 20-26.

In the embodiment just described, the aluminum suspension 24 performs both the mechanical function of supporting the weight of the showerhead 22 and the electrical function of conducting RF power from the manifold back wall 20 to the showerhead. Alternatively, these mechanical and electrical functions can be performed by separate components. For example, US patent application publication no. 2005-0183827 A1 by White et al. dated Aug. 25, 2005 discloses in its FIGS. 2 and 5 a showerhead that is mechanically supported by a dielectric wall. An electrical conductor, which does not provide mechanical support of the showerhead, conducts RF power to the showerhead from the back wall of the gas inlet manifold. Specifically, the electrical conductor has an upper end connected to a point near the perimeter of the lower surface of the manifold back wall and a lower end connected to a point near the perimeter of the upper surface of the showerhead.

2. Reducing Inductance

The plasma chamber includes an RF input 40 to which RF power is supplied by an RF power supply 32 and matching network 34 as described above. A novel feature of the invention is one or more RF bus conductors 43, 44 that couple the RF power from the RF input 40 of the plasma chamber to one or more RF connection points 41, 42 on an electrode 20-26 of the plasma chamber. The electrode capacitively couples the RF power to a plasma in the interior 11 of the plasma chamber between the electrode and the susceptor 12 that supports the workpiece 10.

In the illustrated embodiments, the plasma chamber electrode is a gas inlet manifold 20-26 that includes a manifold back wall 20 through which a gas inlet conduit 28 extends, a showerhead 22 suspended below the back wall, and a showerhead suspension 24 connected between back wall and the showerhead. The RF connection points 41, 42 are on the back wall. However, the scope of the invention includes any other type of electrode that is positioned or configured to capacitively couple RF power from the electrode to a plasma in the interior 11 of the plasma chamber.

In each of the illustrated embodiments, the number of RF connection points 41, 42 on the plasma chamber electrode is two. However, the scope of the invention includes any number of RF connection points between the one or more RF bus conductors and the electrode, including only one RF connection point.

Figure 4:
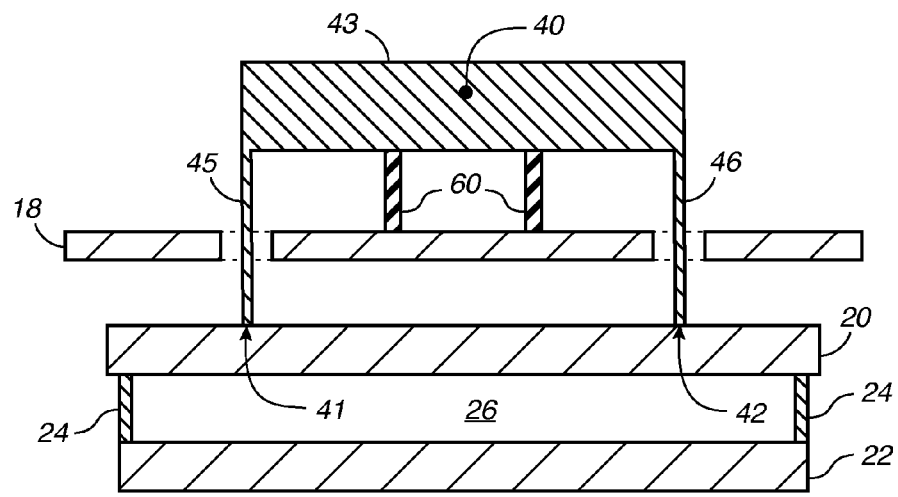
FIG. 4 is a partially schematic sectional side view of the RF bus conductor and top wall of the plasma chamber of FIG. 2. The section is taken through the U-shaped contour of the RF bus conductor.
Figure 5:
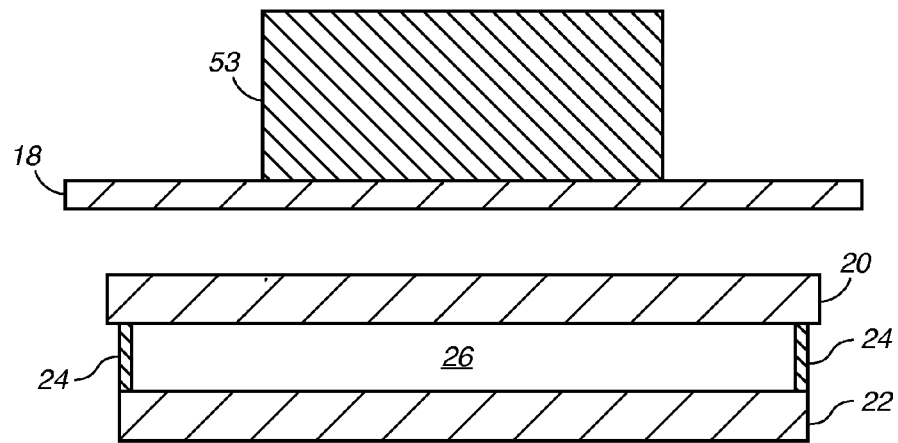
FIG. 5 is a view similar to FIG. 4, except the section is taken through the U-shaped contour of the RF return bus conductor.
Figure 6:
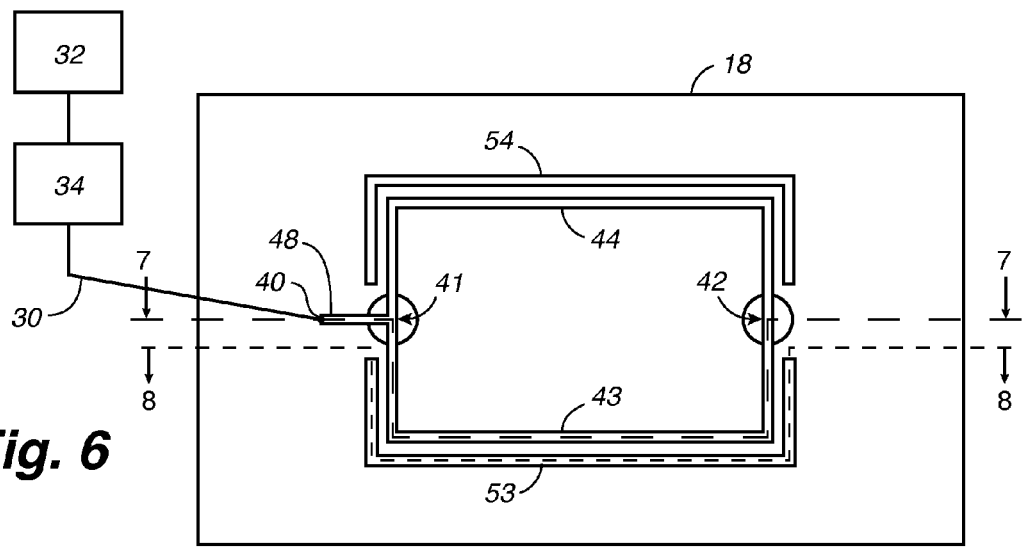
FIG. 6 is a partially schematic sectional top view of the RF bus conductors, RF return bus conductors, and top wall of a second embodiment having two RF bus conductors with an RF input at one end.
Figure 7:
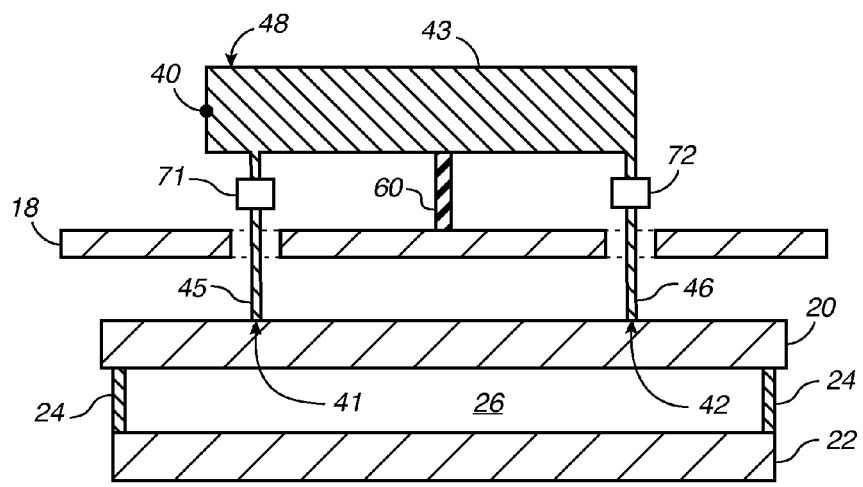
FIG. 7 is a partially schematic sectional side view of the RF bus conductors and top wall of the plasma chamber of FIG. 6. The section is taken through the U-shaped contour of one of the RF bus conductors.
Figure 8:
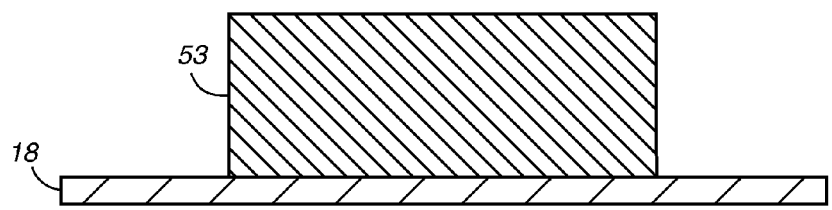
FIG. 8 is a view similar to FIG. 7, except the section is taken through the U-shaped contour of the RF return bus conductor adjacent the RF bus conductor shown in FIG. 7.
Figure 8:
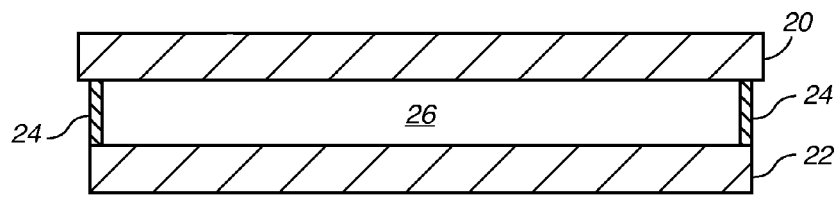
Figure 9:
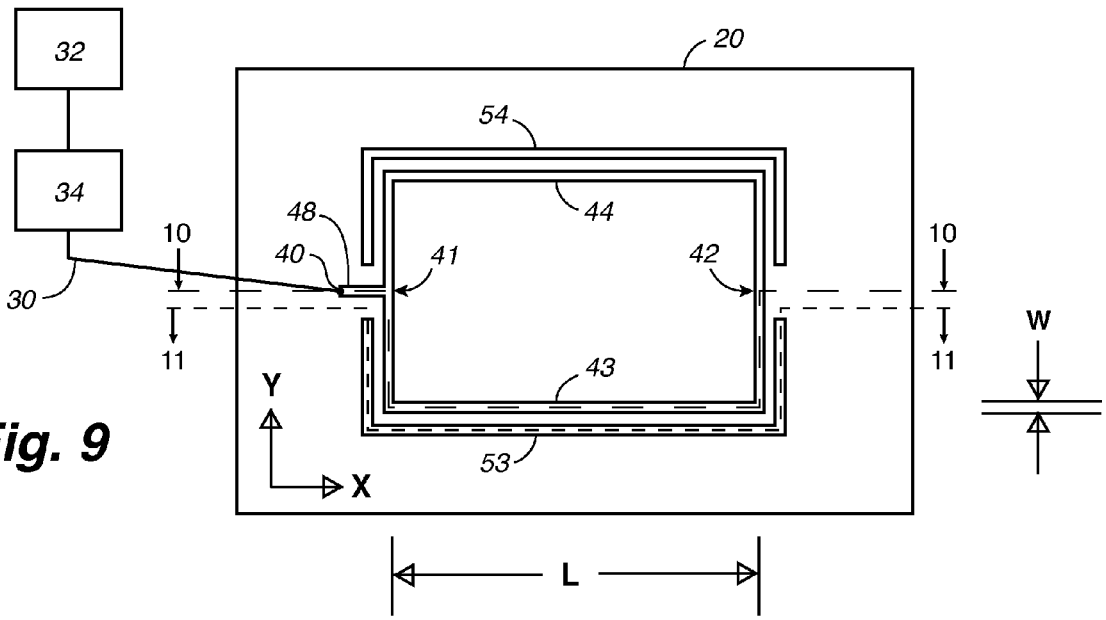
FIG. 9 is a partially schematic sectional top view of the RF bus conductors, RF return bus conductors, and manifold back wall of a third embodiment in which the RF bus conductors and RF return bus conductors are between the manifold back wall and the top wall of the plasma chamber.
Figure 10:
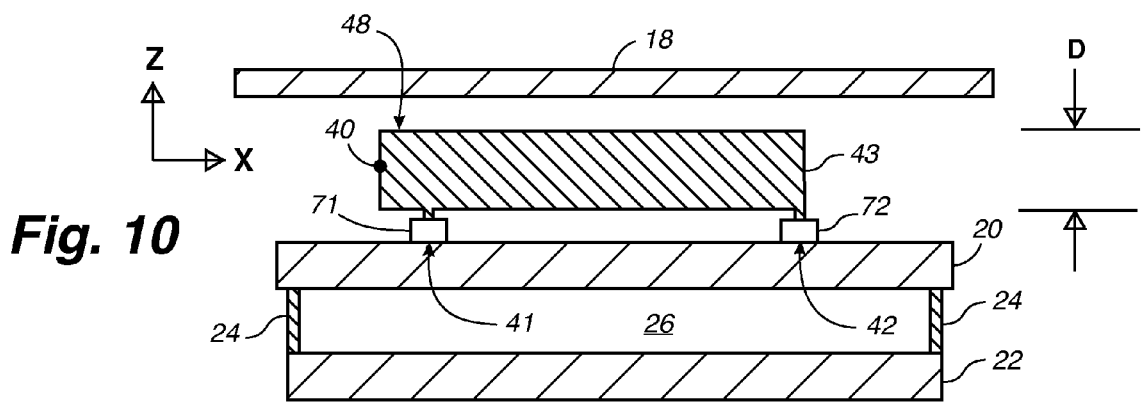
FIG. 10 is a partially schematic sectional side view of the RF bus conductors and manifold back wall of the plasma chamber of FIG. 9. The section is taken through the U-shaped contour of one of the RF bus conductors.
Figure 11:
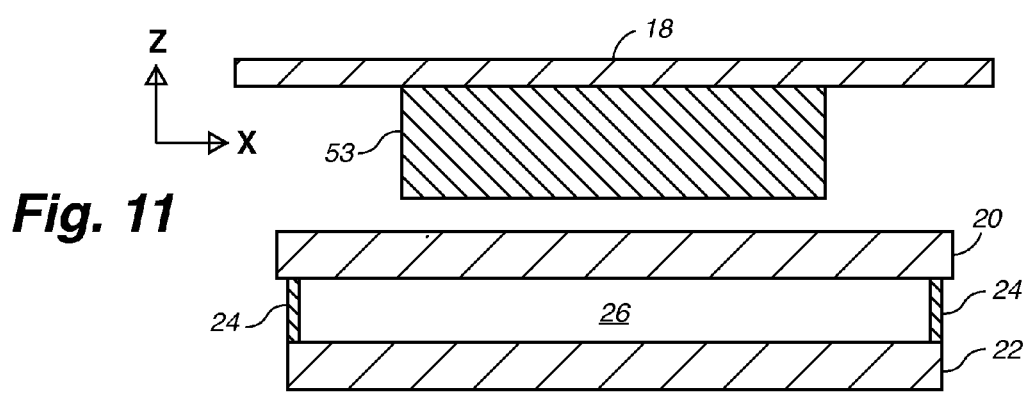
FIG. 11 is a view similar to FIG. 10, except the section is taken through the U-shaped contour of the RF return bus conductor adjacent the RF bus conductor shown in FIG. 10.

FIGS. 2-5 illustrate a plasma chamber according to a first embodiment of the invention having an RF bus conductor 43 and RF return bus conductor 53 that are both U-shaped and above the top wall of the chamber. The RF input 40 of the plasma chamber is a connection point at the center of the RF bus conductor. FIGS. 6-8 illustrate a second embodiment having two U-shaped RF bus conductors 43, 44 connected at one end, with the RF input at that end. FIGS. 9-11 illustrate a third embodiment similar to the second embodiment, but with the RF bus conductors and RF return bus conductors below the top wall of the chamber.

(To simplify FIG. 2, the RF bus conductor 43 and the RF return bus conductor 53 are shown only schematically in FIG. 2, without depicting their shapes. The shapes of the RF bus conductor 43 and the RF return bus conductor 53 are shown in FIGS. 3-11. Also, the gas inlet conduit 28 occupies the same position in each of the illustrated embodiments, but the gas inlet conduit is shown only in FIG. 2 in order to simplify FIGS. 3-11.)

As stated in the preceding "Background" section of this patent description, a shortcoming of conventional designs is that the complex impedance of the electrical load presented to the RF input 40 of the plasma chamber typically has an inductive component significantly greater than its resistive component, which produces high peak voltages in the gas inlet manifold 20-26, the impedance matching network 34, and the RF circuitry connected between them. Such high peak voltage is undesirable because it can cause atmospheric arcing (electrical discharge) in the portions of the RF circuitry that are exposed to atmosphere, and it can cause failure of the capacitors within the RF circuitry.

The invention includes two design features that ameliorate this shortcoming by reducing the inductance of the electrical load impedance at the RF input 40 of the plasma chamber.

Figure 1:
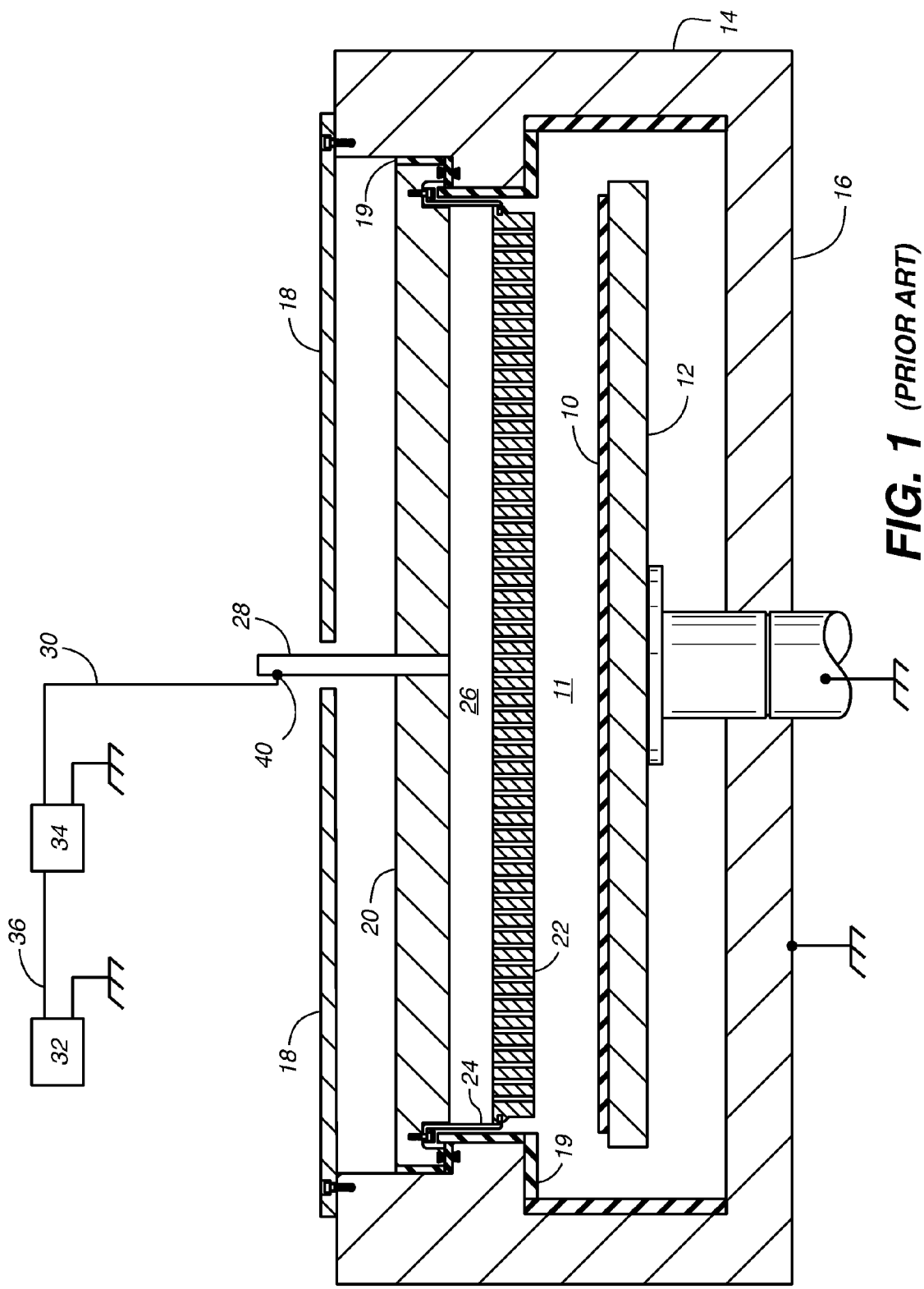
FIG. 1 is a partially schematic sectional side view of a conventional plasma chamber having an RF input at a gas inlet conduit connected to the center of the manifold back wall.

First, the RF input 40 is connected to the manifold back wall 20 at one or more RF connection points 41, 42, none of which is at the center of the manifold back wall. This is in contrast with the conventional plasma chamber of FIG. 1 in which the RF power supply is connected to the center of the manifold back wall. Locating each RF connection point away from the center reduces the inductive component of the load impedance at each RF connection point.

Second, the electrical connection from the RF input 40 to each of the RF connection points 41, 42 on the plasma chamber electrode 20-26 includes one or more electrically shielded RF bus conductors 43, 44 connected between the RF input 40 and each of the RF connection points 41, 42. To advantageously reduce the inductance interposed by the RF bus conductors 43, 44 between each RF connection point 41, 42 and the RF input 40, one or more RF return bus conductors 53, 54 are connected to electrical ground and respectively extend parallel to each respective RF bus conductor 43, 44 (FIGS. 3, 5-6, 8-9 and 11).

More specifically, each RF return bus conductor 53, 54 is electrically connected to one of the electrically grounded walls 14-18 of the plasma chamber. Preferably such connection is implemented by mounting each RF return bus conductor on the electrically grounded top wall 18 of the plasma chamber so as to electrically connect each RF return bus conductor to the top wall. FIGS. 5 and 8 show first and second embodiments in which each RF return bus conductor 53, 54 is mounted on an upper surface of the top wall 18 of the plasma chamber. FIG. 11 show a third embodiment in which each RF return bus conductor 53, 54 is mounted on a lower surface of the top wall 18 of the plasma chamber, so that the RF bus conductors 43, 44 and the RF return bus conductors 53, 54 are between the electrically grounded top wall 18 and the manifold back wall 20 of the RF-powered electrode 20-26.

In the first embodiment of FIGS. 2-5, the RF return bus conductor is radially inward of the RF bus conductor. In the second embodiment of FIGS. 6-8 and the third embodiment of FIGS. 9-11, the opposite is true; each RF return bus conductor 53, 54 is radially outward of its corresponding RF bus conductor 43, 44. Either arrangement is suitable. In embodiments having two RF return bus conductors 53, 54, the two RF return bus conductors can be implemented as a single, continuous conductor rather than as two distinct conductors.

As stated above, RF power flows from the output of the impedance matching network 34 to the RF input 40 of the plasma chamber, then through the one or more RF bus conductors 43, 44 to the one or more RF connection points 41, 42 on the plasma chamber electrode 20-26 (specifically, on the manifold back wall 20), then to the four suspension walls 24 at each of the four sides of the manifold back wall, and then through the four suspension walls to the four sides of the showerhead 22. The RF power is coupled from the showerhead in the interior region 11 of the plasma chamber between the showerhead and the susceptor. Return RF power flows from the plasma to the electrically grounded chamber walls 14-18, and then through the one or more RF return bus conductors 53, 54 to the electrical ground of the impedance matching network 34.

The inductance in the path of RF power flow between the RF input 40 and the plasma can be advantageously reduced by spacing each RF return bus conductor 53, 54 close to its corresponding RF bus conductor 43, 44. Reducing the spacing reduces the inductance. Preferably, such inductance is minimized by spacing each RF bus conductor and its corresponding RF return bus conductor as close together as possible without causing electrical arcing (electrical discharge) between them. The invention also encompasses alternative embodiments based on different definitions of how close such spacing should be to achieve a substantial reduction in the inductance.

In one embodiment, an RF return bus conductor 53, 54 is sufficiently close to its corresponding RF bus conductor 43, 44 so that the capacitance between them is greater than the capacitance between the RF bus conductor and any other electrically grounded conductor.

In a second embodiment, the capacitance between an RF bus conductor 43, 44 and its corresponding RF return bus conductor 53, 54 is greater than the capacitance between that RF bus conductor and the electrically grounded chamber wall 14-18.

In a third embodiment, an RF bus conductor 43, 44 and its corresponding RF return bus conductor 53, 54 have respective surfaces that are parallel and face each other, wherein the two surfaces are separated by a spacing that is less than the spacing between the RF bus conductor and any of the electrically grounded chamber walls that are parallel to the first surface.

In a fourth embodiment, an RF bus conductor 43, 44 and its corresponding RF return bus conductor 53, 54 have respective surfaces that are parallel and face each other, wherein the two surfaces are separated by a spacing that is less than the width of either of the two surfaces in any direction.

In any of the embodiments defined above, one can maximize the benefit of reducing the inductance of the entire RF current path from the output of the impedance matching network 34 to the plasma by maximizing the fraction of such RF current path that is implemented by the parallel, closely-spaced RF bus and RF return bus conductors of the present invention. In other words, it is beneficial for the RF bus and RF return bus conductors to occupy a substantial fraction of such RF current path.

For example, this "substantial fraction" criterion is satisfied if the RF bus conductor occupies at least one-half the length of the electrical connection path extending from the output of the RF impedance matching network to one of the RF connection points 41, 42 on the plasma chamber electrode 20-26. Preferably, the output of the impedance matching network 34 is positioned as close as possible to the RF bus conductor, and the ground connection of the impedance matching network is positioned as close as possible to the RF return bus conductor.

As an alternative example, this "substantial fraction" criterion also is satisfied by the preceding first and second embodiments that are defined in terms of the capacitance between the RF bus and RF return bus conductors, because such capacitance is proportional to the length of the RF bus and RF return bus conductors (as well as being inversely proportional to the spacing between them).

Similarly, in any of the embodiments defined above, one can maximize the benefit of reducing the inductance of the RF current path between two RF connection points 41, 42 on the plasma chamber electrode 20-26 by maximizing the fraction of such RF current path that is implemented by the parallel, closely-spaced RF bus and RF return bus conductors of the present invention. In other words, it is beneficial for the RF bus and RF return bus conductors to occupy a substantial fraction of such RF current path. For example, this criterion is satisfied if the RF bus conductor connected between such two RF connection points 41, 42 has a length greater than one-half the distance between the two RF connection points.

Also, in any of the embodiments defined above, each RF bus conductor 43, 44 preferably is spaced far enough from the grounded top wall 18 to avoid electrical arcing (electrical discharge) between them. In the first embodiment of FIGS. 2-5 and the second embodiment of FIGS. 6-8, this is accomplished by the RF bus conductor 43 including conductive legs 45, 46 that function both to space the RF bus conductor above the grounded top wall 18 and to connect the RF bus conductor to the RF connection points 41, 42 on the manifold back wall 20 (FIGS. 4 and 7). If the RF bus conductor is not mechanically strong enough to be self-supporting, it can be supported by one or more dielectric spacers 60 as shown in FIGS. 4 and 7.

3. Symmetry of RF Bus and RF Power Distribution

Figure 3:
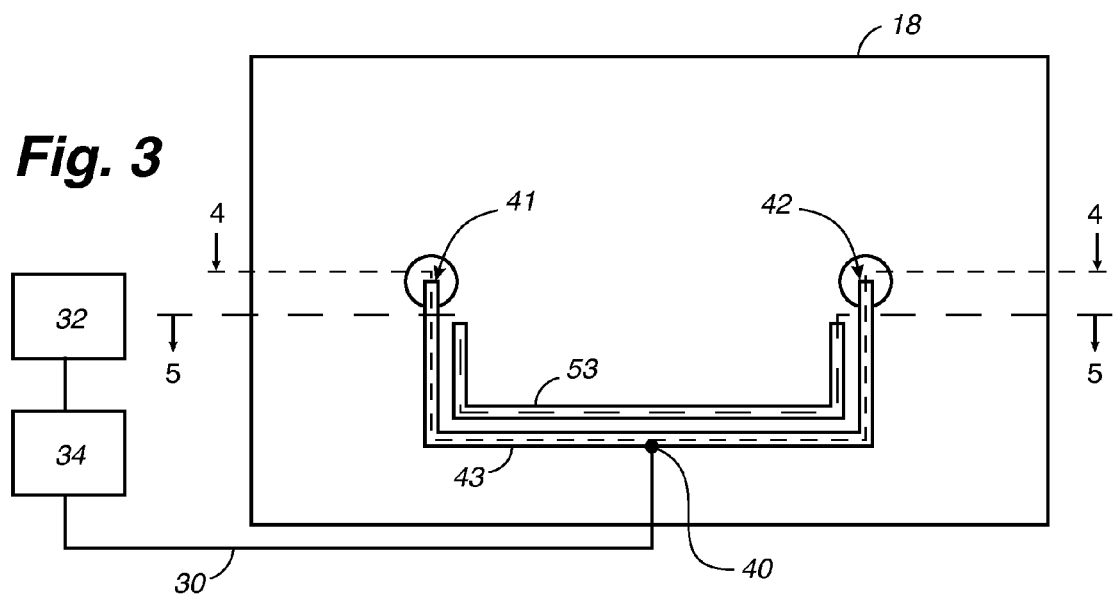
FIG. 3 is a partially schematic sectional top view of the RF bus conductor, RF return bus conductor, and top wall of the plasma chamber of FIG. 2.

In the first embodiment of FIGS. 2-5, the RF bus conductor 43 has two ends respectively connected to the first and second RF connection points 41, 42 (FIGS. 3 and 4). The RF input 40 of the plasma chamber (which receives power from the RF power supply 32 and impedance matching network 34) is a connection point on the RF bus conductor that is midway between the two ends of the RF bus conductor. Consequently, the RF power distribution from the RF input to the two RF connection points 41, 42 is symmetrical and equal.

In the second embodiment of FIGS. 6-8 and the third embodiment of FIGS. 9-11, the RF bus conductor 43, 44 includes two mirror-image conductor segments on opposite halves of the manifold back wall. Each segment 43, 44 of the RF bus conductor extends between, and is connected to, the first and second RF connection points 41, 42. A short conductor 48 extends between the first RF connection point 41 and the RF input 40. The two segments 43, 44 of the RF bus conductor preferably are implemented as a single, continuous conductor as shown in FIGS. 6 and 9. but the two segments 43, 44 alternatively could be implemented as two distinct conductors (not shown).

In the second embodiment of FIGS. 6-8 and the third embodiment of FIGS. 9-11, the RF input 40 is much closer to the first RF connection point 41 than the second RF connection point 42. Specifically, the RF input is almost coincident with the first RF connection point 41, whereas the RF conductors 43, 44 are interposed between the RF input and the second RF connection point 42. Therefore, unlike the first embodiment of FIGS. 2-5, the RF power distribution from the RF input to the two RF connection points 41, 42 is asymmetrical and may be unequal.

Consequently, it may be necessary to provide an additional impedance in series with one or both RF connection points to provide a desired ratio of RF power distribution to the two RF connection points. FIGS. 7 and 10 illustrate that such impedance can be first and second capacitors 71, 72 connected between the first and second RF connection points 41, 42, respectively, and the RF bus conductor 43. The capacitors can be fixed or adjustable. The difference or ratio between the respective capacitances of the two capacitors can be adjusted or established so as to produce either an equal supply of RF power from the RF input to the two RF connection points, or else so as to produce a desired ratio between the respective levels of RF power supplied to the two RF connection points.

In an alternative embodiment (not shown) having only one capacitor 71 (i.e., omitting the second capacitor 72), the capacitor can be connected between only one of the drive RF points 41, 42 and the RF bus conductor 43, with the other RF connection point being connected directly to the RF bus conductor without any intervening capacitor. The capacitor can be fixed or adjustable. In this embodiment, the capacitance of the capacitor can be adjusted or established so as to produce either an equal supply of RF power from the RF input to the two RF connection points, or else so as to produce a desired ratio between the respective levels of RF power supplied to the two RF connection points.

The capacitors 71, 72 in the embodiments of FIGS. 7 and 10 provide the additional advantage of offsetting the inductance of the load impedance at the RF connection points 41, 42 so as to reduce the imaginary part of the complex impedance at the RF input 40. To similarly reduce the inductance in the embodiment of FIGS. 3-5, it may be advantageous to add capacitors 71, 72 connected in series between the respective RF connection points 41, 42 and the RF bus conductor 43.

4. Curvature of RF Bus and RF Return Bus

As stated in the above section "2. Reducing Inductance", one design feature that reduces the inductance of the RF current path between the RF input 40 and the manifold back wall 20 is to position the RF connection points 41, 42 away from the center of the back wall. For example, FIGS. 2, 3, 6 and 9 show various embodiments having two RF connection points 41, 42 located symmetrically on opposite sides of the center of the back wall.

FIG. 2 shows that the gas inlet conduit 28 extends through the center of the back wall. (As explained earlier, the gas inlet conduit occupies the same position in each of the illustrated embodiments, but the gas inlet conduit is shown only in FIG. 2 in order to simplify FIGS. 3-11.) To avoid mechanical interference with the gas inlet conduit at the center of the back wall, the RF bus conductors 43, 44 and the RF return bus conductors 53, 54 are curved in the shape of a "U" (as shown in FIGS. 3, 6 and 9) so that the RF bus conductors can connect to the two RF connection points 41, 42 on opposite sides of the center of the back wall. In other words, the RF bus conductors and the RF return bus conductors each include two 90-degree angles.

To achieve the desired low inductance described above, an RF bus conductor and its corresponding RF return bus conductor preferably have corresponding curved portions that are aligned so that their respective facing surfaces are parallel and, more preferably, maintain a uniform spacing, as shown in FIGS. 3, 6 and 9.

Although the RF bus conductors and RF return bus conductors are curved in the shape of a "U" and have 90-degree angles in each of the illustrated embodiments, the invention defined in the preceding paragraph applies to RF bus conductors and RF return bus conductors having any curved shape.

5. RF Bus Conductor Oriented Perpendicular to Electrode

The RF bus conductor 43, 44 preferably has a transverse cross section whose shape is rectangular with the long dimension of the rectangle oriented perpendicular to the adjacent surface of the manifold back wall 20. An example of such an RF bus conductor is a metal strip. A thin, wide metal strip readily can be bent in the shape of a "U" as illustrated in FIGS. 3, 6 and 9 so that it can maintain a large radial distance from the center of the manifold.

This shape of RF bus conductor 43, 44 is especially advantageous in the third embodiment of FIGS. 9-11 in which there is no electrical ground plane between the RF bus conductor and the manifold back wall 20. The illustrated U-shape, semi-circular shape, or other shape that maintains the entire length of the RF bus conductor away from the center of the manifold back wall, is advantageous to reduce the inductive component of the impedance presented to the RF cable 30 at the RF input 40.

A further advantage of an RF bus conductor 43, 44 having a transverse cross section whose longest dimension is oriented perpendicular to the manifold back wall (as described in the two preceding paragraphs) is that such orientation reduces capacitive coupling between the RF bus conductor and the manifold back wall 20. The locations of the one or more RF connection points 41, 42 on the manifold back wall typically are determined to achieve a desired spatial distribution of RF field in the interior 11 of the plasma chamber. Also, as explained above, the RF connection points may be located a substantial distance from the center of the manifold back wall to reduce the inductance of the path of RF current flow. Both of these benefits can be diminished if a substantial fraction of the RF power is conducted between the RF bus conductor and the manifold back wall through parasitic capacitance between them rather than through the RF connection points 41, 42 at which the power is intended to be conducted.

According to one aspect of the invention, such parasitic capacitance can be reduced by the RF bus conductor 43, 44 having a transverse cross section whose longest dimension is oriented perpendicular to the surface of the plasma chamber electrode that is closest to the RF bus conductor, as illustrated in FIGS. 9-11. Preferably such transverse cross section is rectangular.

The advantageous reduction in parasitic capacitance achieved by the invention described in this section "5. RF Bus Conductor Oriented Perpendicular to Electrode" do not require an RF return bus conductor. Therefore, such invention, in which the RF bus conductor has a transverse cross section perpendicular to the electrode, is useful independently of the inventions described in the preceding sections of this patent description that require an RF return bus conductor.

In the illustrated embodiment, the plasma chamber electrode is the gas inlet manifold 20-26, and the surface is the upper surface of the manifold back wall 20. However, the invention broadly applies to any other type or shape of plasma chamber electrode.

6. Other Modifications

In the illustrated embodiments, the gas inlet manifold 20-26 is the electrode that functions to couple RF power from the RF power supply 32 to a plasma within the plasma chamber. However, the RF connection points 41, 42 of the illustrated embodiments can be replaced by RF connection points on any conventional plasma chamber electrode, regardless of whether the electrode also functions to dispense gas. In other words, the electrode need not be part of a gas inlet manifold and need not include a showerhead. Therefore, all references herein to a manifold back wall can be replaced by references to an electrode having such RF connection points 41, 42.

The illustrated gas inlet manifold 20-26 is rectangular because the illustrated plasma chamber is adapted for processing a rectangular workpiece. However, the invention is equally applicable to a plasma chamber adapted for processing a circular workpiece, and the gas inlet manifold 20-26 or other plasma chamber electrode can be circular.

The illustrated manifold back wall 20 is not divided into segments. However, in some applications it may be desirable to divide the manifold back wall or other electrode into segments. In that case, the manifold back wall described in this patent specification encompasses all segments of the manifold back wall or other electrode collectively as a single electrode.

Although the present invention primarily relates to capacitively coupling RF power to the plasma, additional RF power may be coupled to the plasma by other means such as an induction coil or a microwave waveguide. Also, plasma generated in a remote plasma source may be supplied to the chamber interior through a gas inlet.

All references to a conductor connected between two points should be interpreted to included a plurality of electrical components that conduct RF power and that are collectively connected between such two points, including components connected to each other in series or parallel. Examples of such electrical components that conduct RF power include capacitors and inductors.

The invention claimed is:

1. Apparatus for coupling RF power to the interior of a plasma chamber, comprising:
    a plasma chamber having one or more electrically grounded chamber walls;
    a plasma chamber electrode that is within the plasma chamber and insulated from electrical ground, wherein the plasma chamber electrode includes first and second connection points, a back wall, a showerhead below the back wall, and an electrical conductor connected between the back wall and the showerhead;
    a gas inlet conduit extending through the center of the back wall, wherein the first and second connection points of the plasma chamber electrode are on the back wall on opposite sides of, and spaced away from, the gas inlet conduit;
    an RF bus conductor having a first end portion, a second end portion and a central portion connected between the end portions, wherein the first and second end portions are parallel to each other and the central portion is perpendicular to the end portions such that the RF bus conductor has a U-shape circumventing the gas inlet conduit, and wherein the first and second end portions respectively include first and second connection points that are respectively connected to the first and second connection points of the plasma chamber electrode by conductive legs; and
    an RF return bus conductor that is distinct from each of the electrically grounded chamber walls and that is electrically connected to one of the electrically grounded chamber walls, wherein the RF return bus conductor includes a first end portion, a second end portion, and a central portion that respectively are parallel to the first end portion, the second end portion, and the central portion of the RF bus conductor such that the RF return bus conductor has a U-shape parallel to the U-shape RF bus conductor;

wherein:
said central portion of the RF bus conductor includes a first surface between the first and second connection points of the RF bus conductor that is rectangular, planar and has a length greater than one-half the distance between the first and second connection points of the plasma chamber electrode;
the central portion of the RF return bus conductor includes a second surface positioned parallel and face-to-face with said first surface of the RF bus conductor, wherein the second surface is rectangular, planar, and has a length greater than one-half the distance between the first and second connection points of the plasma chamber electrode;
the first surface of the RF bus conductor is closer to the second surface of the RF return bus conductor than it is to any of the electrically grounded chamber walls that are parallel to the first surface; and
no portion of the RF bus conductor between the first and second connection points of the RF bus conductor is electrically connected to the plasma chamber electrode.

2. The apparatus of claim 1, wherein:
the first and second surfaces are separated by a spacing that is less than the width of the first surface in any direction and is less than the width of the second surface in any direction.

3. The apparatus of claim 1, wherein:
the capacitance between the RF bus conductor and the RF return bus conductor is greater than the capacitance between the RF bus conductor and the chamber wall.

4. The apparatus of claim 1, wherein:
the plasma chamber electrode is positioned so as to capacitively couple RF power into the plasma chamber.

5. The apparatus of claim 1, further comprising:
an RF impedance matching network having an output connected to said RF bus conductor so as to provide an electrical connection path from the output of the RF impedance matching network to said one or more connection points on the plasma chamber electrode;
wherein at least one-half the length of the electrical connection path extending from the output of the RF impedance matching network to one of said connection points includes the RF bus conductor.

6. The apparatus of claim 1, further comprising a capacitor connected between the RF bus conductor and one of the connection points.

7. The apparatus of claim 1, further comprising:
an RF impedance matching network having an output connected to supply RF power to the RF bus conductor.

* * * * *